(12) United States Patent
Luo et al.

(10) Patent No.: US 7,177,158 B1
(45) Date of Patent: Feb. 13, 2007

(54) PRESS-ACTIVATED ELECTRONIC COMPONENT DISCHARGING FACILITATING APPARATUS

(75) Inventors: Zi-Gui Luo, Taipei (TW); Fred Chen, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/365,267

(22) Filed: Feb. 28, 2006

(51) Int. Cl.
*H05K 7/00* (2006.01)
*H05K 1/16* (2006.01)

(52) U.S. Cl. ..................................... 361/734; 174/260

(58) Field of Classification Search ................ 361/734, 361/715, 729; 174/260, 262
See application file for complete search history.

(56) References Cited

U.S. PATENT DOCUMENTS 4,228,793 A * 10/1980 Ramey ...................... 601/57

\* cited by examiner

*Primary Examiner*—Elvin Enad
*Assistant Examiner*—Thanh S. Phan
(74) *Attorney, Agent, or Firm*—Peter F. Corless; Steven M. Jensen; Edwards Angell Palmer & Dodge LLP

(57) ABSTRACT

A press-activated electronic component discharging facilitating apparatus is proposed, which is designed for use with a battery-powered electronic component, such as a CMOS (Complementary Metal Oxide Semiconductor) memory unit installed on a computer motherboard, for providing the CMOS memory unit with a user-operated press-activated discharging facilitating function, and which is characterized by the capability of allowing the user to facilitate the discharging of the CMOS memory unit simply by pressing the battery cell used to power the CMOS memory unit, without having to dismount the battery cell from the motherboard and flip hardware jumpers as in the case of prior art. This feature allows the discharging process of the CMOS memory to be carried out more conveniently and efficiently.

6 Claims, 2 Drawing Sheets

PRESS-ACTIVATED ELECTRONIC COMPONENT DISCHARGING FACILITATING APPARATUS

BACKGROUND OF THE INVENTION

1. Field of the Invention

This invention relates to electronics technology, and more particularly, to a press-activated electronic component discharging facilitating apparatus which is designed for use with a battery-powered electronic component, such as a CMOS (Complementary Metal Oxide Semiconductor) memory unit installed on a computer motherboard, for providing the CMOS memory unit with a user-operated press-activated discharging facilitating function that allows the user to facilitate the discharging of the CMOS memory unit simply by pressing the battery cell used to power the CMOS memory unit.

2. Description of Related Art

A computer's motherboard is typically provided with a battery-powered special-purpose memory unit for storing a set of important system configuration data, such as clock data, passwords, and so on, which allows the computer system to nonetheless hold these data while powered off. In actual implementation, this special-purpose memory unit is typically a CMOS (Complementary Metal Oxide Semiconductor) based memory unit which is powered by a small battery cell, typically a button battery, such that when the computer system is powered off, the battery cell can still supply electrical power to the CMOS memory to allow the CMOS memory to retain its clock function.

In actual application, when the user needs to clear all data in the CMOS memory, a discharging process is performed on the CMOS memory to drain all the electrical charges I that represent data in the CMOS memory. A conventional method for discharging a CMOS memory unit includes a first step of dismounting the CMOS memory's battery cell from the motherboard, and a second step of short-circuiting the negative electrode and the positive electrode of the CMOS memory unit by means of manually flipping hardware jumpers on the motherboard.

In practice, however, the above-mentioned method for discharging CMOS memory has several drawbacks. First, the dismounting of the battery cell is quite laborious and tedious and would easily cause damage to the battery cell. Second, the dismounted battery cell would be easily lost due to its very small size. Third, the flipping of the jumpers requires the user to consult technical manuals to find the correct way to do it, and therefore is quite laborious and time-consuming and thus inefficient.

SUMMARY OF THE INVENTION

It is therefore an objective of this invention to provide a press-activated electronic component discharging facilitating apparatus which allows the user to activate a CMOS memory unit to undergo a discharging process without having to dismount its battery cell from the motherboard.

It is another objective of this invention to provide a press-activated electronic component discharging facilitating apparatus which can protect the CMOS memory's battery cell from being damaged during the discharging process.

It is still another objective of this invention to provide a press-activated electronic component discharging facilitating apparatus which can prevent the CMOS memory's battery cell from being lost during the discharging process It is yet another objective of this invention to provide a press-activated electronic component discharging facilitating apparatus which allows a CMOS memory unit to undergo a discharging process without having to use hardware jumpers.

The press-activated electronic component discharging facilitating apparatus according to the invention is designed for use with a battery-powered electronic component, such as a CMOS (Complementary Metal Oxide Semiconductor) memory unit installed on a computer motherboard, for providing the CMOS memory unit with a user-operated press-activated discharging facilitating function that allows the user to discharge the CMOS memory unit simply by pressing the battery cell used to power the CMOS memory unit.

In structure, the press-activated electronic component discharging facilitating apparatus according to the invention comprises: (A) a supportive base, which is used to support the battery cell, and which is structured with a first connecting portion and a second connecting portion, wherein the first connecting portion is electrically connected to the first-type electrode of the electronic component, while the second connecting portion is electronic component to the second-type electrode of the same electronic component; (B) an electrically-conductive elastic member, which has a first end and a second end, wherein the first end is mechanically linked and electrically connected to the first connecting portion of the supportive base, while the second end is abutted to and in electrical connection with the first-type electrode of the battery cell; and (C) an electrically-conductive switching member, which is mounted on the supportive base and electrically connected to the second connecting portion of the supportive base, and which is structured with a first contact portion and a second contact portion, wherein in the condition that the electrically-conductive elastic member is in unpressed state, the second end of the electrically-conductive elastic member urges against the battery cell and thereby causes the second-type electrode of the battery cell to come in electrical contact with the first contact portion of the electrically-conductive switching member; and whereas in the condition that the electrically-conductive elastic member is in pressed state due to the battery cell being subjected to an external pressing force, the external pressing force on the battery cell causes the second-type electrode of the battery cell to be separated and electrically disconnected from the first contact portion of the electrically-conductive switching member and meanwhile causes the first-type electrode of the battery cell to come in electrical contact with the second contact portion of the electrically-conductive switching member.

The press-activated electronic component discharging facilitating apparatus according to the invention is characterized by the capability of providing a CMOS memory unit with a user-operated press-activated discharging facilitating function that allows the user to facilitate the discharging of the CMOS memory unit simply by pressing the battery cell used to power the CMOS memory unit, without having to dismount the battery cell from the motherboard and flip hardware jumpers as in the case of prior art. This feature allows the discharging process of the CMOS memory to be carried out more conveniently and efficiently.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The press-activated electronic component discharging facilitating apparatus according to the invention is disclosed in full details by way of preferred embodiments in the following with reference to the accompanying drawings.

Figure 1:
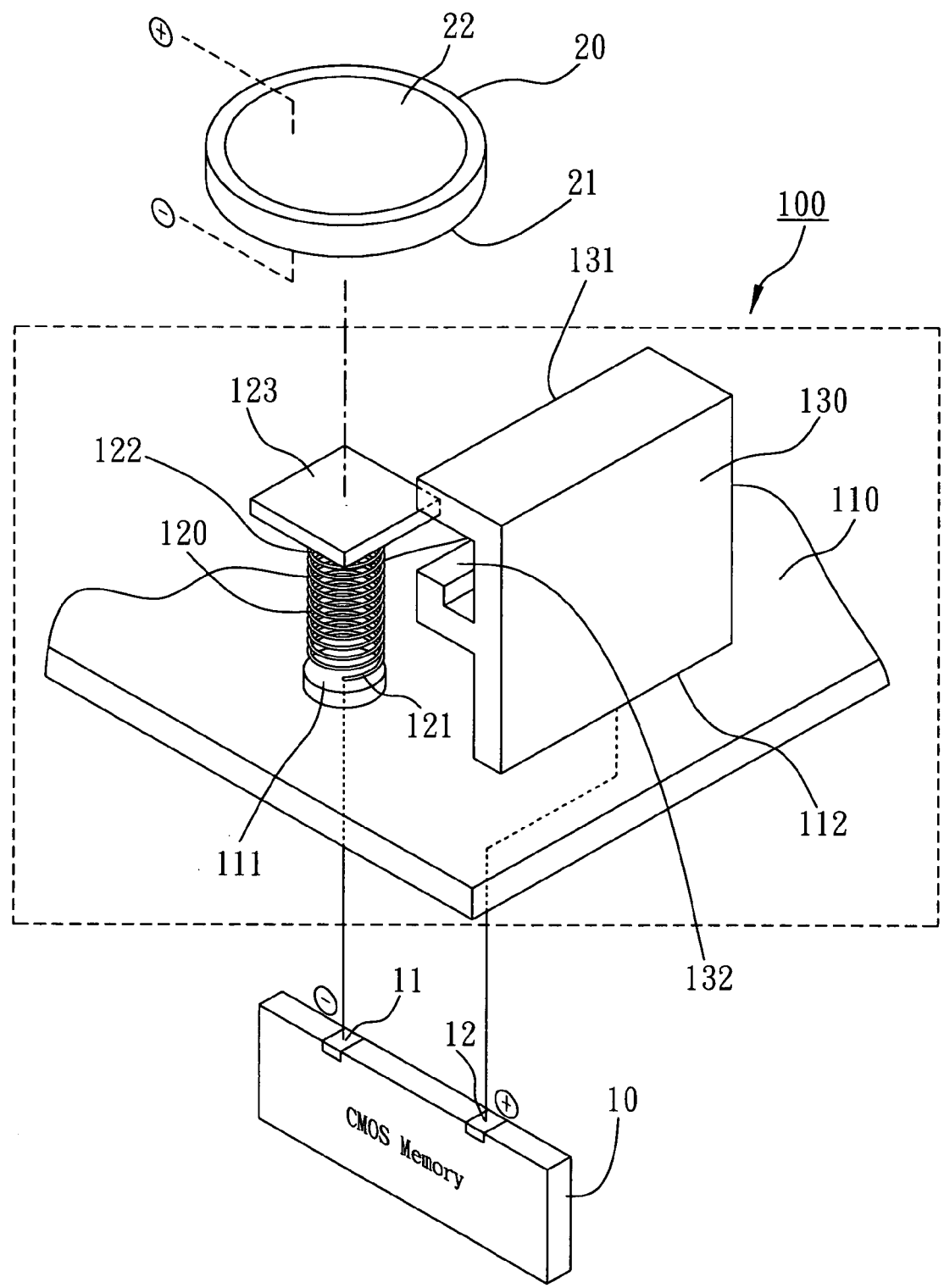
FIG. 1 is a schematic diagram showing a perspective view of the press-activated electronic component discharging facilitating apparatus according to the invention.

FIG. 1 is a schematic diagram showing a perspective view of the application and structure of the press-activated electronic component discharging facilitating apparatus according to the invention (as the part enclosed in the dotted box indicated by the reference numeral 100). As shown, the press-activated electronic component discharging facilitating apparatus of the invention 100 is designed for use in conjunction with a battery-powered electronic component, such as a CMOS (Complementary Metal Oxide Semiconductor) memory unit 10, which is powered by a battery cell 20, such as a button battery (or called coin battery), for the purpose of providing the CMOS memory unit 10 with a user-operated press-activated discharging facilitating function that allows the user to facilitate the discharging of the CMOS memory unit 10 simply by pressing the battery cell 20; i.e., in normal operation, the press-activated electronic component discharging facilitating apparatus of the invention 100 allows the battery cell 20 to supply electrical power to the CMOS memory unit 10, and when it is needed to discharge the CMOS memory unit 10, the user needs just to press against the battery cell 20 with his/her finger to activate the discharging process.

In the embodiment of FIG. 1, for example, the battery cell 20 is a lithium/magnesium dioxide battery cell, which has a flat back surface serving as a negative electrode (−) 21 and a flat front surface serving as a positive electrode (+) 22; and correspondingly, the CMOS memory unit 10 has a negative electrode (−) 11 and a positive electrode (+) 12. In actual applications, the battery cell 20 can supply electrical power to the CMOS memory unit 10 simply by connecting the negative electrode (−) 21 and the positive electrode (+) 22 thereof respective to the negative electrode (−) 11 and the positive electrode (+) 12 of the CMOS memory unit 10; and when it is needed to discharge the CMOS memory unit 10, this purpose can be achieved simply by short-circuiting the negative electrode (−) 11 and the positive electrode (+) 12 of the CMOS memory unit 10. Further, it is to be noted that in the embodiment of FIG. 1, the battery cell 20 is oriented in such a manner that its negative electrode (−) 21 faces upwards and its positive electrode (+) 22 faces downwards; but in other applications, the electrode orientation of the battery cell 20 can be reversed.

As shown in FIG. 1, the press-activated electronic component discharging facilitating apparatus of the invention 100 comprises: (A) a supportive base 110; (B) an electrically-conductive elastic member 120; and (C) an electrically-conductive switching member 130. Firstly, the respective attributes and purposes of the constituent components 110, 120, 130 of the press-activated electronic component discharging facilitating apparatus of the invention 100 are described in details in the following.

The supportive base 110 is designed for integration to a circuit board (not shown), such as a computer motherboard, for accommodating the battery cell 20, and which is structured with a first connecting portion 111 and a second connecting portion 112. In the embodiment of FIG. 1, the first connecting portion 111 is used for electrical connection to the negative electrode (−) 11 of the CMOS memory unit 10, while the second connecting portion 112 is used for electrical connection with the positive electrode (+) 12 of the same CMOS memory unit 10.

The electrically-conductive elastic member 120 is for example a metal-made spring or other functionally equivalent device, which has a first end 121 and a second end 122, wherein the first end 121 is mechanically linked and electrically connected to the first connecting portion 111 of the supportive base 110, while the second end 122 is abutted to and in electrical contact with the first-type electrode of the battery cell 20. In practical implementation, for example, an electrically-conductive supportive disk 123 can be optionally attached to the second end 122 of the electrically-conductive elastic member 120 for providing a more secured support to the battery cell 20.

The electrically-conductive switching member 130 is a specially-designed metal member which is formed with a first contact portion 131 and a second contact portion 132, and whose bottom side is securely attached to the supportive base 110 and electrically connected to the second connecting portion 112 of the supportive base 110. In actual application, as illustrated in FIG. 2A, in the condition that the electrically-conductive elastic member 120 is in unpressed state and freely extended upwards, the second end 122 of the electrically-conductive elastic member 120 will urge against the bottom side of the battery cell 20 and thereby cause the positive electrode (+) 22 on the upper side of the battery cell 20 to come in electrical contact with the first contact portion 131 of the electrically-conductive switching member 130; and whereas as illustrated in FIG. 2B, in the condition that the electrically-conductive elastic member 120 is in pressed state due to the battery cell 20 being subjected to an external pressing force (indicated by the arrow in FIG. 2B), the external pressing force on the battery cell 20 causes the positive electrode (+) 22 of the battery cell 20 to be separated from (and thus electrically disconnected) the first contact portion 131 of the electrically-conductive switching member 130 and instead causes the negative electrode (−) 21 on the bottom side of the battery cell 20 to come in electrical contact with the second contact portion 132 of the electrically-conductive switching member 130.

The following is a detailed description of a practical example of the application of the press-activated electronic component discharging facilitating apparatus of the invention 100 during actual application. In this application example, it is assumed that the battery cell 20 is oriented in such a manner that its negative electrode (−) 21 faces upwards and its positive electrode (+) 22 faces downwards; but in other applications, the electrode orientation of the battery cell 20 can be reversed.

Figure 2A:
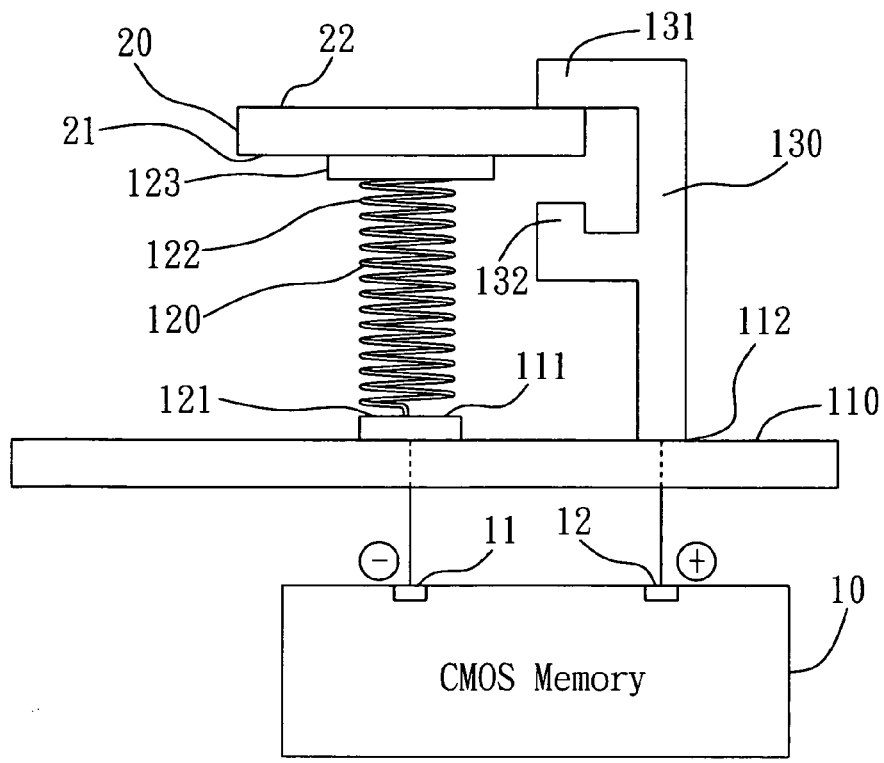
FIG. 2A is a schematic diagram showing a side view of the press-activated electronic component discharging facilitating apparatus of the invention shown in FIG. 1 while in unpressed state.

As shown in FIG. 2A, when the battery cell 20 is mounted in position on the supportive base 110, its negative electrode (−) 21 faces upwards and its positive electrode (+) 22 faces downwards to be supported on the electrically-conductive supportive disk 123, whereby the positive electrode (+) 22 of the battery cell 20 comes in electrical contact with the electrically-conductive supportive disk 123 while the negative electrode (−) 21 of the battery cell 20 is forcibly abutted against the first contact portion 131 due to the elastic force of the electrically-conductive elastic member 120. Under this condition, the negative electrode (−) 21 on the bottom side of the battery cell 20 is electrically connected via the electrically-conductive elastic member 120 to the negative electrode (−) 11 of the CMOS memory unit 10, while the positive electrode (+) 22 of the battery cell 20 is electrically connected via the electrically-conductive switching member 130 to the positive electrode (+) 12 of the CMOS memory unit 10, thereby establishing a circuit loop that allows the battery cell 20 to supply electrical power to the CMOS memory unit 10.

Figure 2B:
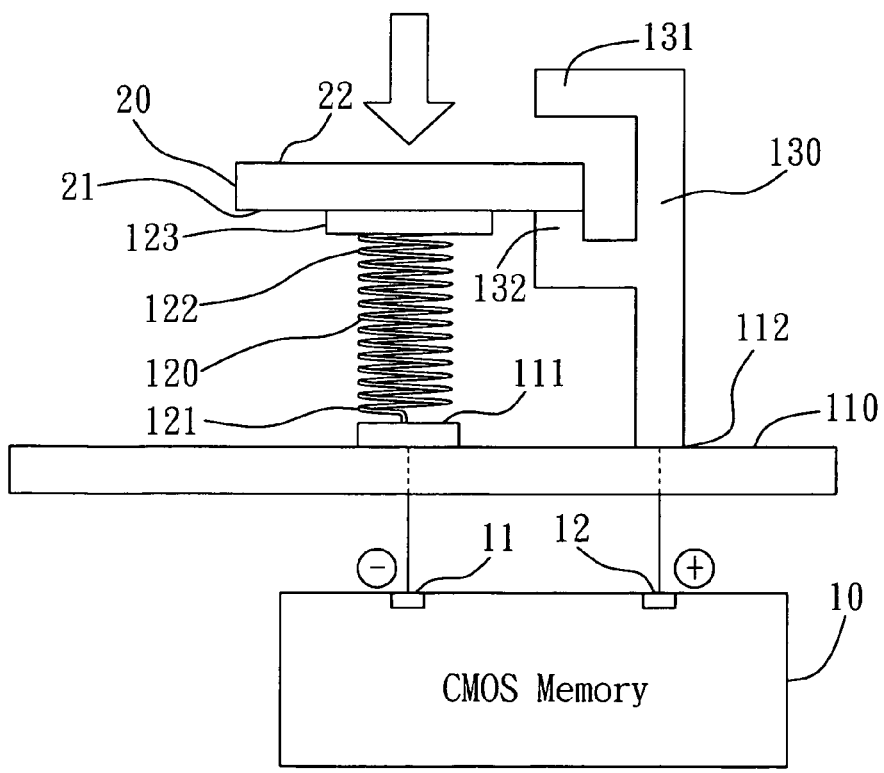
FIG. 2B shows the same of FIG. 2A except when in pressed state to activate a discharging process.

Afterwards, as shown in FIG. 2B, when it is needed to discharge the CMOS memory unit 10, the user needs just to press against the upward-facing side of the battery cell 20. This pressing action will cause the electrically-conductive elastic member 120 to be compressed and the battery cell 20 to be shifted downwards in position, thereby causing the positive electrode (+) 22 on the front side of the battery cell 20 to be separated and electrically disconnected from the first contact portion 131 of the electrically-conductive switching member 130, and meanwhile causing the negative electrode (−) 21 on the back side of the battery cell 20 to come in electrical contact with the second contact portion 132 of the electrically-conductive switching member 130. Under this condition, since the positive electrode (+) 22 of the battery cell 20 is no longer in electrical contact with the first contact portion 131 of the electrically-conductive switching member 130, the circuit loop for supplying electrical power to the CMOS memory unit 10 is broken. However, at this time, since the negative electrode (−) 21 of the battery cell 20 is still in electrical connection with the negative electrode (−) 11 of the CMOS memory unit 10 via the electrically-conductive elastic member 120, and since the negative electrode (−) 21 is now also in electrical connection with the positive electrode (+) 12 of the CMOS memory unit 10 via the electrically-conductive switching member 130, it effectively short-circuits the negative electrode (−) 11 and the positive electrode (+) 12 of the CMOS memory unit 10, thereby allowing the CMOS memory unit 10 to be discharged through this short-circuited loop.

After the discharging process is completed, the user needs just to withdraw his/her finger from the battery cell 20, and the compressed electrically-conductive elastic member 120 will cause the battery cell 20 to be restored to its original position shown in FIG. 2A, thereby allowing the battery cell 20 to again supply electrical power to the CMOS memory unit 10.

In conclusion, the invention provides a press-activated electronic component discharging facilitating apparatus which is characterized by the capability of providing a CMOS memory unit with a user-operated press-activated discharging facilitating function that allows the user to facilitate the discharging of the CMOS memory unit simply by pressing the battery cell used to power the CMOS memory unit, without having to dismount the battery cell from the motherboard and flip hardware jumpers as in the case of prior art. This feature allows the discharging process of the CMOS memory to be carried out more conveniently and efficiently. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A press-activated electronic component discharging facilitating apparatus for use with an electronic component that is powered by a battery cell, where the electronic component and the battery cell each has a first-type electrode and a second-type electrode for electrical connection with each other, for the purpose of providing the electronic component with a press-activated discharging facilitating function;

the press-activated electronic component discharging facilitating apparatus comprising:

a supportive base, which is used to support the battery cell, and which is structured with a first connecting portion and a second connecting portion, wherein the first connecting portion is electrically connected to the first-type electrode of the electronic component, while the second connecting portion is electronic component to the second-type electrode of the same electronic component;

an electrically-conductive elastic member, which has a first end and a second end, wherein the first end is mechanically linked and electrically connected to the first connecting portion of the supportive base, while the second end is abutted to and in electrical connection with the first-type electrode of the battery cell; and an electrically-conductive switching member, which is mounted on the supportive base and electrically connected to the second connecting portion of the supportive base, and which is structured with a first contact portion and a second contact portion, wherein in the condition that the electrically-conductive elastic member is in unpressed state, the second end of the electrically-conductive elastic member urges against the battery cell and thereby causes the second-type electrode of the battery cell to come in electrical contact with the first contact portion of the electrically-conductive switching member; and whereas in the condition that the electrically-conductive elastic member is in pressed state due to the battery cell being subjected to an external pressing force, the external pressing force on the battery cell causes the second-type electrode of the battery cell to be separated and electrically disconnected from the first contact portion of the electrically-conductive switching member and meanwhile causes the first-type electrode of the battery cell to come in electrical contact with the second contact portion of the electrically-conductive switching member.

2. The press-activated electronic component discharging facilitating apparatus as recited in claim 1, wherein the electronic component is a CMOS (Complementary Metal Oxide Semiconductor) memory unit.

3. The press-activated electronic component discharging facilitating apparatus as recited in claim 1, wherein the battery cell is a button cell.

4. The press-activated electronic component discharging facilitating apparatus as recited in claim 1, wherein the battery cell is a lithium/magnesium dioxide battery cell.

5. The press-activated electronic component discharging facilitating apparatus as recited in claim 1, wherein the electrically-conductive elastic member is made of metal.

6. The press-activated electronic component discharging facilitating apparatus as recited in claim 1, further comprising:

an electrically-conductive supportive disk, which is attached to the second end of the electrically-conductive elastic member for providing a support to the battery cell.

* * * * *